United States Patent [19]

Prest et al.

[11] Patent Number: 5,408,421
[45] Date of Patent: Apr. 18, 1995

[54] PORTABLE BATTERY BACK-UP DATA CARTRIDGE

[76] Inventors: Edward Prest, 382 Fernand Street, Fabreville, Laval, Quebec, Canada, H7P 2J7; Bruce Glen, 195 Sherwood, Beaconsfield, Quebec, Canada, H9W 2G9; Joseph Schweitzer, 8272 Des Rapides, LaSalle, Quebec, Canada, H8P 2V7

[21] Appl. No.: 707,156
[22] Filed: May 28, 1991
[51] Int. Cl.⁶ .............................................. G04G 5/00
[52] U.S. Cl. .................................... 364/569; 364/187; 368/55
[58] Field of Search .............. 364/550, 424.01, 424.03, 364/424.04, 431.11, 143, 184, 187, 145, 424.05, 431.12, 569; 368/46, 53, 55

[56] References Cited

U.S. PATENT DOCUMENTS

| | | |
|---|---|---|
| 4,258,421 | 3/1981 | Juhasz et al. |
| 4,344,136 | 8/1982 | Panik . |
| 4,371,934 | 2/1983 | Wahl et al. |
| 4,399,524 | 8/1983 | Muguruma et al. |
| 4,400,783 | 8/1983 | Locke, Jr. et al. ................ 364/483 |
| 4,551,801 | 11/1985 | Sokol . |
| 4,580,248 | 4/1986 | Imalzumi . |
| 4,587,640 | 5/1986 | Saitoh . |
| 4,607,351 | 8/1986 | Gerber et al. |
| 4,644,368 | 2/1987 | Mutz . |
| 4,654,829 | 3/1987 | Jiang et al. |
| 4,677,429 | 6/1987 | Glotzbach . |
| 4,757,454 | 7/1988 | Hisatake et al. |
| 5,016,223 | 5/1991 | Kimura et al. |
| 5,046,007 | 9/1991 | McCrery et al. ................ 364/550 X |

FOREIGN PATENT DOCUMENTS 1228672 10/1987 Canada .

OTHER PUBLICATIONS

Epson-IC Memory Cards-Computer Design, Jul. 1991 p. 85.
Intel-Flash-4 MByte Memory Card-Electronic Engineering Times-Jul. 8, 1991-p. 67.

*Primary Examiner*—Emanuel T. Voeltz
*Assistant Examiner*—Edward Pipala

[57] ABSTRACT

The cartridge has a memory for containing an information set, a status flag and a buffer for receiving an update to the information set, the update representing a change to only a part of the information set, and a data and power connector for connecting the cartridge to a host computer, the connector being able to receive power from the host computer and exchange data when connected to the host computer. The cartridge includes a power supply election switch including a battery for selectively supplying power from the host computer when the connector is connected and from the battery when disconnected. The update is transferred to the buffer and subsequently from the buffer to the information set in response to the status flag, such that in the event of a disconnection, while the update is being received, the information set is not partially updated. The cartridge may also include a real time clock and a copy of the time when the real time clock was set by the host in the memory, so that the host may use the clock setting of the real time clock if the copy of the time when the real time clock was set is more recent than the time when a clock on the host was set, such that when the cartridge is used between a plurality of host computers, a more accurate and recent clock setting may be transferred between the plurality of host computers by the cartridge.

7 Claims, 3 Drawing Sheets

PORTABLE BATTERY BACK-UP DATA CARTRIDGE

FIELD OF THE INVENTION

The present invention relates to a portable battery back-up data cartridge system including a host computer and a data cartridge, a portable battery back-up data cartridge, and a method for carrying out a back-up on a portable battery back-up data cartridge.

BACKGROUND OF THE INVENTION

Portable battery back-up data cartridges are commonly used for recording and transferring data between host computers, and more particularly between a field host computer and a base host computer.

An example of a computer system involving a field computer and a base computer with a data cartridge transferring information between the field and the base computers is given in U.S. Pat. No. 4,258,421 (Juhasz et al.), wherein a vehicle monitoring and recording system is disclosed. In such an environment, where the data recorded on the data cartridges includes parameters which undergo continuous updating (such as distance, fuel consumption, speed, RPM, battery voltage, oil pressure, fuel filter, cooling pressure, air pressure, brake temperature, cooling temperature, fuel temperature, and oil coolant level), it is important that the update of the data on the data cartridge be completed before the data cartridge is disconnected. In the case of an environment such as the cab of a semi-trailer truck, the data cartridge may be disconnected at any random time and it is important to prevent a partial update of the data contained on the data cartridge, as this can produce inconsistencies in the data recorded thereon.

Previous data cartridges concerned themselves with protecting the information which was being written at the moment of physical disconnection, by using connector pins that disconnected in a fixed mechanical sequence. For example, shorter pins which are disconnected first provide an early warning signal that a disconnection is imminent. It is also known that once the advent of a power failure is detected, means can be provided to switch to a battery backup power supply for keeping the memory in the cartridge alive while disconnected. An example of such a cartridge memory protection system is described in U.S. Pat. No. 4,607,351 (Gerber et al.).

Previous data cartridges do not concern themselves with the fact that multiple-byte records may be required to update the data structure held in the cartridge memory.

It is also important in computer processing environments, where the keeping of an accurate clock time is important, that the updating of real time clocks used in the field host computers be updated consistently with respect to the base host computers. The prior art data cartridges do not provide for the inclusion of a real time clock that can be utilized for field system real time clock updating, where the field system is able to select the freshest or most accurate time presented to it by any one of several cartridges presented to it.

SUMMARY OF THE INVENTION

It is an object of the present invention to provide a portable battery back-up data cartridge system in which an update to data contained on the data cartridge will be carried out indivisibly. "Indivisible" means that either none or a whole of the update will be transferred to the data contained in the data cartridge with no possibility of only part of the update being recorded even if the cartridge power is disconnected while the data transfer is being made.

Another object of the present invention is to provide a portable battery back-up data cartridge which contains a real time clock along with a copy of the time when the real time clock was set so that, as the cartridge is transferred from a base host computer to a field host computer, the field host computer may use the clock setting of the cartridge if the copy of the time when the real time clock was set by the base host computer is more recent than the time when the field host clock was set. In this way, the portable battery back-up data cartridge can be used as a way to transfer a more accurate and recent clock setting between a number of host computers, so that the host computer clocks be updated with the best or most accurate times.

According to the invention, there is provided a portable battery back-up data cartridge comprising a data memory containing an information set, a status flag, and a buffer for receiving an update to the information set, the update representing a change to only a part of the information set; data and power connector means for connecting the cartridge to a host computer, the connector means being able to receive power from the host computer when connected thereto and able to exchange data between the host computer and the data memory when connected to the host computer; and power supply switching means including a battery for selectively supplying power from the host computer when the connector means are connected to the host computer and from the battery at least to the memory when the connector means are disconnected; the update to be transferred to the buffer and subsequently from the buffer to the information set in response to the status flag, whereby in the event of a disconnection, while the update is being received the information set is not partially updated.

According to the invention, there is also provided a portable battery back-up data cartridge comprising a real time clock; a data memory for storing data, the memory comprising a copy of the time when the real time clock was set by the host; data and power connector means for connecting the cartridge to a host computer, the host computer having a host clock and a recording in memory of the time when the host clock was set, the connector means being able to receive power from the host computer when connected thereto and able to exchange data between the host computer and the data memory and the real time clock when connected thereto; power supply switching means including a battery for selectively supplying power from the host computer when the connector means are connected to the host computer and from the battery when the connector means are disconnected at least to the memory means and the real time clock, whereby when the cartridge is connected to the host, the host may use the clock setting if the copy of the time when the real time clock was set is more recent than the time when the host clock was set, such that when the cartridge is used between a plurality of host computers, a more accurate and recent clock setting may be transferred between the plurality of host computers by the cartridge.

Furthermore, the invention provides a method for carrying out an update to an information set stored in a memory contained in a portable battery back-up data cartridge, the update representing a change to only a part of the information set and comprising a plurality of records to be stored at predetermined locations within the information set, the method comprising the steps of transferring the records from a host computer to a buffer contained in the memory along with address information for each record; setting a flag contained in the memory on the data cartridge to indicate that all the records have been received by the buffer; transferring the records from the buffer to the information set stored in the memory at the address locations recorded with the records in the buffer; and setting the flag to indicate when the records have been transferred from the buffer to the information set, whereby in the event of a disconnection of the data cartridge from the host computer, while the update is being transferred to the data cartridge, the information set is not partially updated.

BRIEF DESCRIPTION OF THE DRAWINGS

The invention will now be better understood by way of the following description of preferred embodiments with reference to the appended drawings, wherein.

DETAILED DESCRIPTION OF THE PREFERRED EMBODIMENTS

Figure 4:
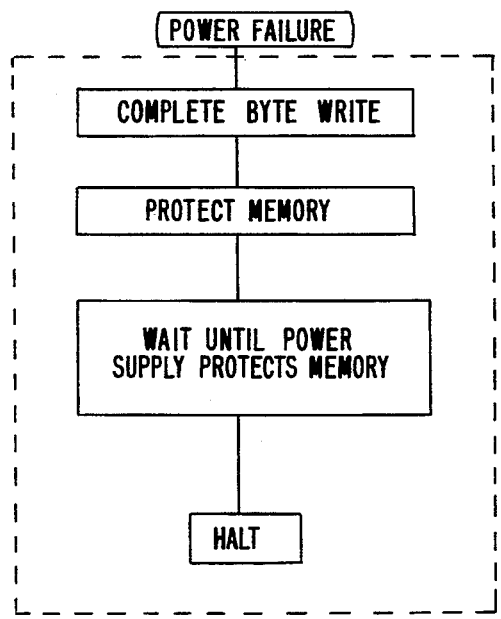
FIG. 4 is a flow chart illustrating a power failure shutdown procedure.

According to the first preferred embodiment, data cartridge (1) comprises a coupling connector (23) having a power connector and a serial data connector. An RS 232/422 or equivalent interface is provided on board a microcomputer chip (4). The cartridge power supply (7) includes a battery for providing battery back-up power to memory (5) and real time clock (6) when a loss of the power supply is detected. As is known in the art, the cartridge power supply (7) may comprise a capacitor for providing a very short duration power supply to the microcomputer during the shut down period. As shown in FIG. 4, the power failure procedure carried out by microcomputer (4) involves: completing the single byte memory transfer in process, disabling memory chip (5), clock (6) and halting operation until the power level resumes a normal level. An interrupt is generated on microcomputer 4 when the power level is detected to be below a certain threshold level, the threshold level being high enough to continue supplying power to operate the microcomputer (4) for a brief period of time.

Microcomputer (4) is a dedicated self-contained processing system programmed with all the functions required to carry out the cartridge operations and the communication levels required of coupling (23), which is not limited to only the functions described herein. The microcomputer (4) is a self-contained byte oriented computer containing program instructions, temporary memory locations and I/O such as the well known INTEL 8051 family. Because this microcomputer is byte oriented, all transfers are performed byte by byte and a byte transfer to external memory can be, and in this case is, indivisible. Other manufactured microcomputers may be of word or larger organizations, in which case the reference here to indivisible byte transfers would not be a limiting factor in this disclosure.

The cartridge coupling (23) upon mating will connect power to supply (17) and microcomputer (4) and if the power remains stable for about 100 ms, the microprocessor will start operating. This delay guarantees the energy storage components in supply (17) will be able to power the microcomputer (4) for the time to complete a minimum of one but typically a few byte transfers when the cartridge power is removed.

Figure 3:
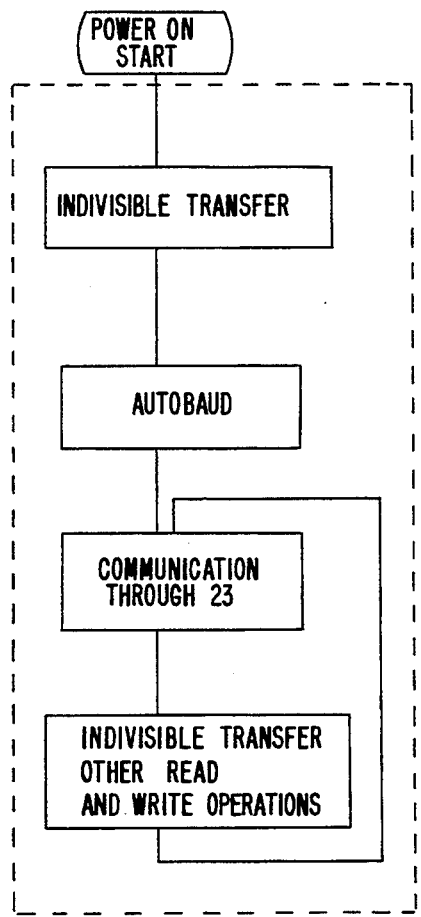
FIG. 3 is a flow chart illustrating a power up function according to the first preferred embodiment.

The cartridge will power up, as shown in FIG. 3, by first performing any remaining memory transfers and next by initiating an autobaud communication speed detection sequence for coupling (23) by measuring the bit width timing of the first ASCII letter 'A' sent to it from host (20). After this, the coupling (23) is ready to accept any commands from host (20). Because this sequence is done immediately before any communications are permitted through (23), any host system will be communicating with a cartridge that has already transferred all its multiple byte records and is correctly updated.

Figure 1:
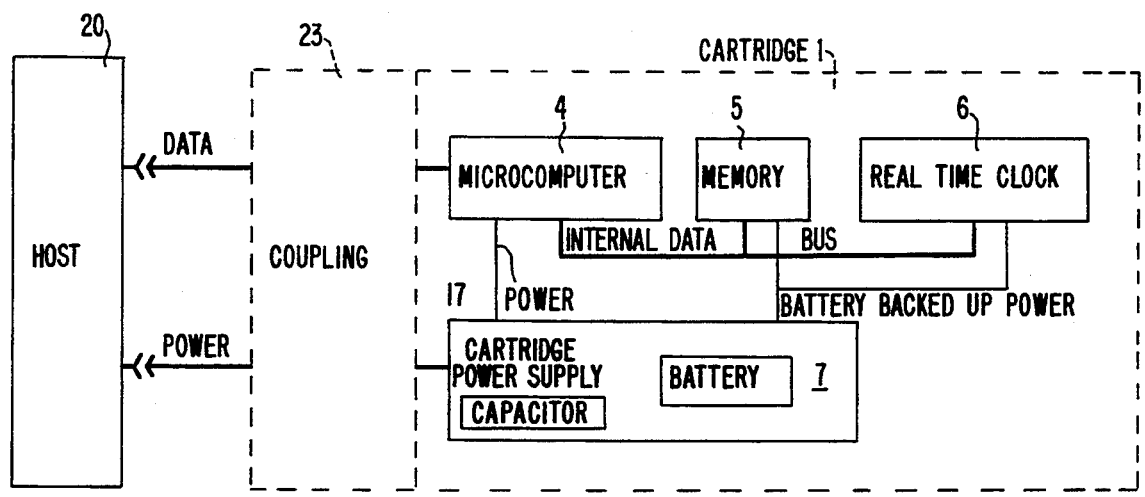
FIG. 1 is a block diagram of a battery back-up data cartridge according to the first preferred embodiment.
Figure 2:
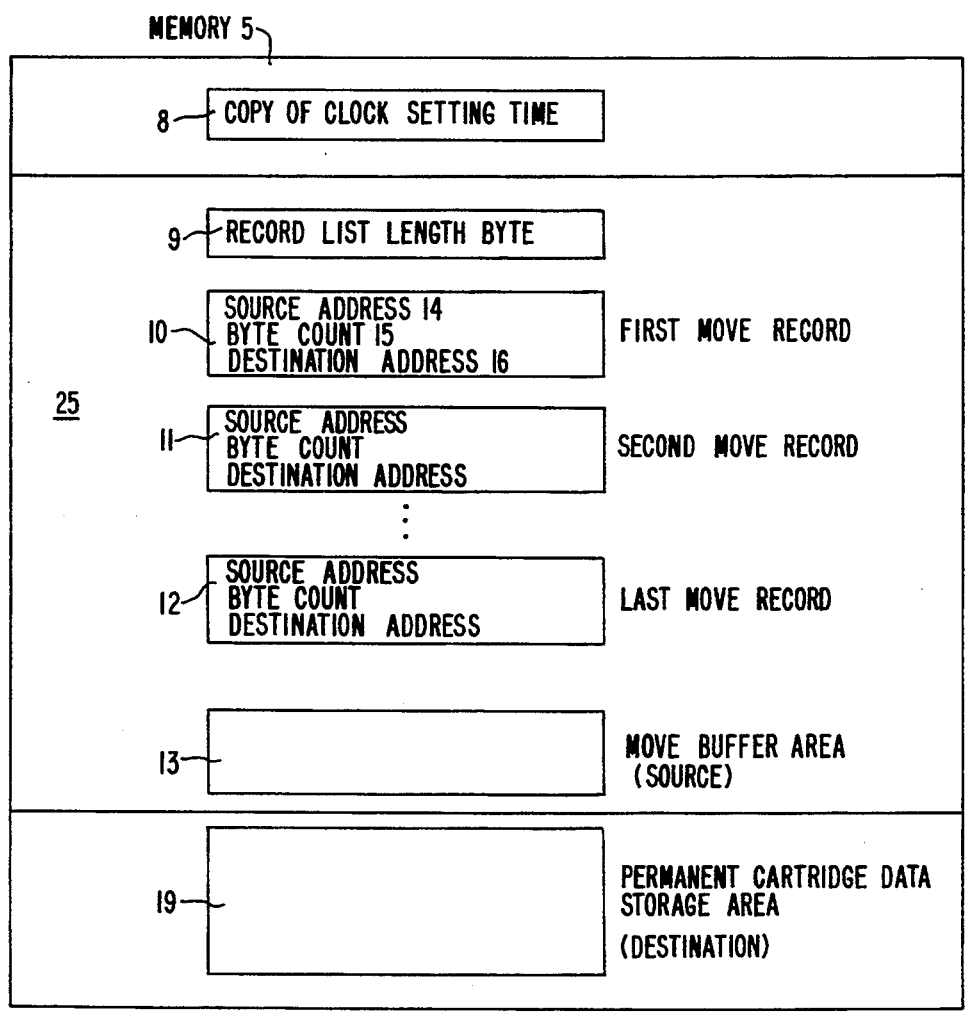
FIG. 2 is a block diagram of a memory map of the cartridge memory according to the first preferred embodiment.

As shown in FIG. 2, memory (5) includes a copy of the clock setting time which are memory locations which store the date and time when real time clock (6) was set by a host computer. When cartridge (1) is plugged into a field host computer (20), the field host computer (20) will read the clock setting time (8) recorded in memory (5). If the copy of the clock setting time in memory (5) is more recent than a copy of the clock setting time of a clock contained on host (20) (not shown schematically in the drawings), then host (20) will read the clock setting of real time clock (6) and use such clock setting as the updated clock setting of the clock on the host computer (20) and will then set its clock setting time to be that of the copy of clock setting time (8) contained in memory (5).

In this way, when less accurate real time clocks are used in the host computer (20) or in cartridge (1), and time drifts of a few seconds per day occur, it is then possible to keep field host computers well supplied with accurate clock settings. Real time clocks drift with temperature and other factors. It is presumed that a more recently set real time clock will have the most accurate setting. Of course, the update intervals in the field are not predictable. When a computer system consists of one base host computer and several field host computers between which data is to be transferred by battery back-up data cartridges, all host computers in the system will maintain approximately the same real time clock setting so long as there is substantially frequent exchange of data cartridges.

With reference to FIGS. 2 and 3, the indivisible data transfer according to the first preferred embodiment will be described. Memory (5) includes a general buffer designated generally by reference numeral (25) which includes record list length-byte (9) and a plurality of move record addresses (10), (11) and (12), and a corresponding plurality of records to be moved from source buffer (13) to the data set storage area (19). Each move record address (10), (11) and (12) contains a source address (14) (pointing to buffer (13)), a byte-count (15)

and a destination address (16) (in area (19)). Once all move records of the update are recorded in the buffer (13), the record list length byte (9) is changed from 0 to a non-zero value indicating that the update is not complete, to a value pointing to the last move record (12) in buffer (13). Once the record list length byte (9) is set, the indivisible update is considered to be "armed".

Data bytes in memory locations (9) through (12) are reserved for the storage of source and destination addresses in the cartridge memory areas (13) and (19). To load (write) data into the cartridge, the data is first loaded through coupling (23) into temporary storage area or source buffer (13) without touching area (19). The final destination address in the cartridge memory area of this data to be loaded into area (19) is put into destination location (16) and the actual location of the block or data put into temporary storage area (13) is loaded into location (14), and the size of the block is loaded into location (15). At this point, no data has been written into the permanent data area (19) containing data previously loaded and which is to be preserved and so the cartridge will not appear to be corrupted if any of these preliminary operations is interrupted by disconnecting the cartridge power.

Since record list length-byte (9) is only a single byte in length, and it is impossible with the power failure detection carried out by power supply (7) and microcomputer (4) that a byte of data be incorrectly transferred from host (20) to cartridge (1), cartridge (1) cannot be incorrectly armed. Thus, once the update records, addresses and byte-counts are fully transferred to buffer (25) and the single byte record list length-byte (9) is set, the microcomputer (4) in response to the record list length-byte (9) will carry out the transfer of the last move record (12) from buffer area (13) to permanent cartridge data storage area (19) and then decrement the record list length-byte (9) and carry out successive record moves from buffer (13) to storage area (19) until the first move record (10) is transferred and the record list length-byte (9) is set to 0.

Microcomputer (4) is programmed to check record list length-byte (9) upon reconnection to a power source of host (20). If record list length-byte is not 0, then there are records to be moved from buffer (13) to storage area (19) and the microcomputer (4) sets out to carry out the record moves until record list length-byte (9) is decremented down to 0. At which point, microcomputer (4) will carry out autobaud and then other data transfer functions as required by the host (20).

Figure 5:
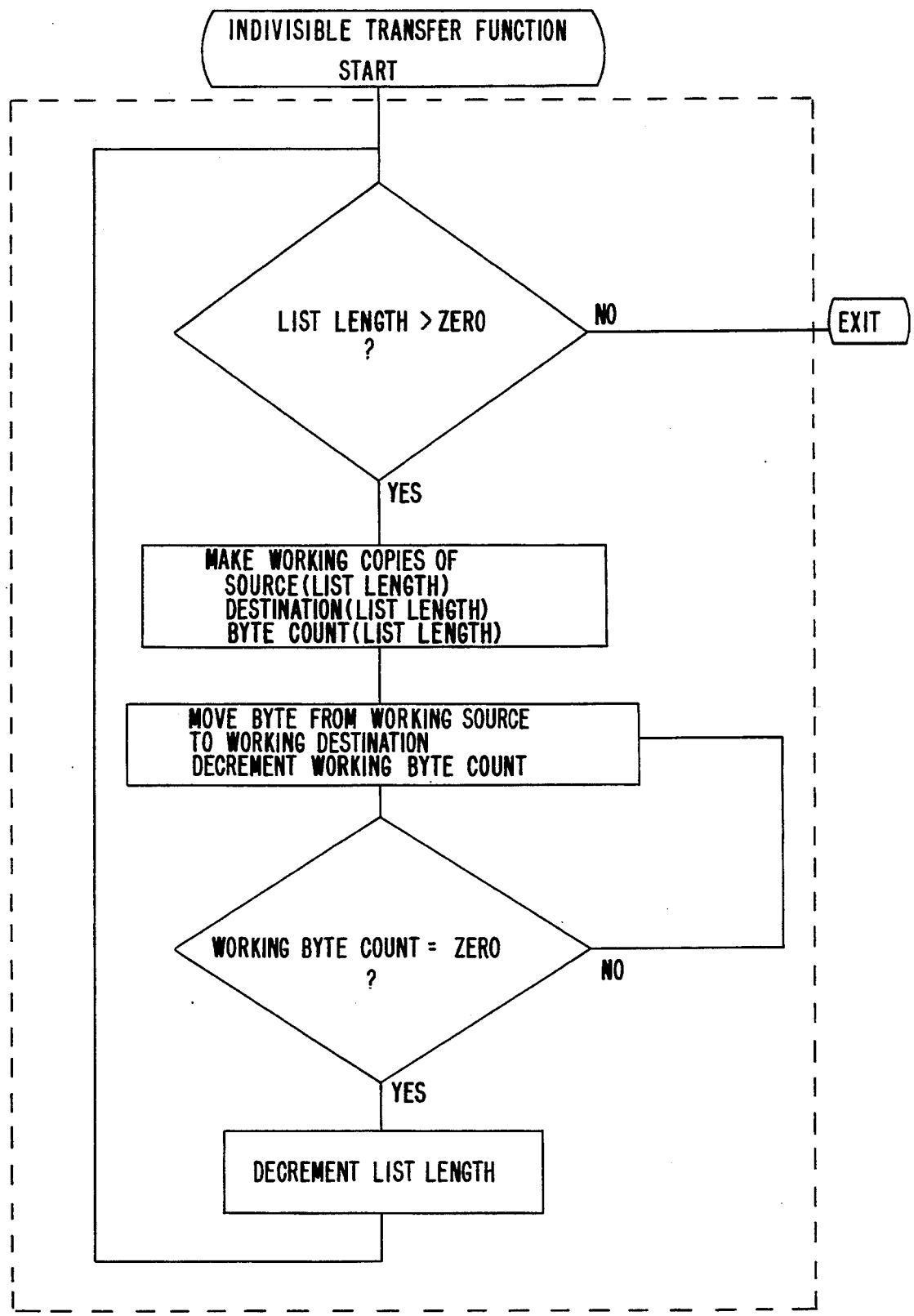
FIG. 5 is a flow chart illustrating an indivisible transfer function according to the first preferred embodiment.

FIG. 5 illustrates the logic flow of the indivisible transfer function in which microcomputer (4) reads record list length-byte (9) to determine whether an indivisible transfer function is to take place, i.e. whether the list length is greater than 0. If the list length is greater than 0, copies of the source address, the destination address and the byte-count are made. The copy of bytes from the update contained in move buffer area (13) located at the source address (14) of the given move record address (10), (11) and (12) to storage area (19) at the destination address (16) plus the byte-count is carried out and the working byte-count is decremented until the working byte-count is reduced to 0 at which point list length-byte (9) is decremented and the process returns to checking whether list length-byte (9) is greater than 0.

As shown in FIG. 4, when a dip in the power supply is detected by microcomputer (4), indicating that a power failure is imminent, microcomputer (4) finishes the byte transfer in progress, disables all memory chips (5) and clock (6) on cartridge (1) and then goes into a state of waiting until the power supply (7) returns normal power to microcomputer (4). In the preferred embodiment, cartridge power supply (7) backs up only memory (5) and real time clock (6) and not microcomputer (4). Therefore, the indivisible transfer function, if interrupted by a power failure (disconnection), would only recontinue when cartridge (1) is reconnected to any host (20).

If host (20) is unable to detect a disconnection of cartridge (1), memory (5) may further include an identifier in a given memory location, which the host will read before carrying out any read or write operations in order to verify that the cartridge to which it is connected is the same cartridge (1) to which it was previously connected and therefore determine whether, in the case of a new cartridge, update of the host real time clock should be carried out.

The indivisible transfer function as shown in FIG. 3 and the memory map shown in FIG. 2 can also be used effectively when cartridge (1) does not have its own data processing means and instead relies on host (20) to carry out the necessary memory transfer functions, although it is preferred that cartridge (1) have its own processor.

What is claimed is:

1. A portable battery back-up data cartridge comprising:
   a data memory containing an information set, a status flag, and a buffer for receiving an update to said information set, said update representing a change to only a part of said information set;
   data and power connector means for connecting the cartridge to a host computer, the connector means being able to receive power from the host computer when connected thereto and able to exchange data between the host computer and the data memory when connected to the host computer; and
   power supply switching means including a battery for selectively supplying power from the host computer when the connector means are connected to the host computer and from the battery at least to said memory when the connector means are disconnected;
   said update to be transferred to said buffer and subsequently from said buffer to said information set in response to said status flag, whereby in the event of a disconnection, while said update is being received said information set is not partially updated.

2. The data cartridge as claimed in claim 1, further comprising a microcomputer for transferring said update from said buffer to said information set, controlling and setting said status flag, and for transferring data of said information set from the data memory to the host computer via said connectors means.

3. The cartridge as claimed in claim 2, wherein said microcomputer includes a serial digital data interface forming a part of said connector means being able to receive data from and transmit data to the host computer when connected thereto.

4. The cartridge as claimed in claim 3, wherein the power supply switching means further include a capacitor for providing a short duration continued power supply when the cartridge is disconnected from the host, and power disconnect indicating means for indicating to the microcomputer that a power failure will occur, so that the microcomputer can halt operation, the battery providing power during disconnection from the host computer to the data memory and not to the microcomputer.

5. The data cartridge as claimed in claim 1, wherein the host computer is provided with a host clock and a recording in memory of the time when the host clock was set, the data cartridge further comprising a real time clock having a clock setting, the data memory further including a copy of the time when said real time clock was set by the host computer, the power supply switching means providing battery power to said real time clock when the connector means are disconnected, whereby when the cartridge is connected to a plurality of host computers, a host computer connected to the data cartridge may use said clock setting to set the host clock if said copy of the time when said real time clock was set is more recent than the time when the host clock was set.

6. A portable battery back-up data cartridge comprising:
   a real time clock;
   a data memory for storing data, said memory comprising a copy of the time when said real time clock was set;
   data and power connector means for connecting the cartridge to a host computer, the host computer having a host clock and a recording in memory of the time when the host clock was set, the connector means being able to receive power from the host computer when connected thereto and able to exchange data between the host computer and the data memory and the real time clock when connected thereto;
   power supply switching means including a battery for selectively supplying power from the host computer when the connector means are connected to the host computer and from the battery when the connector means are disconnected at least to said memory means and said real time clock, whereby when the cartridge is connected to the host, the host may use said clock setting if said copy of the time when said real time clock was set is more recent than the time when the host clock was set, such that when the cartridge is used between a plurality of host computers, a more accurate and recent clock setting may be transferred between the plurality of host computers by the cartridge.

7. A method for carrying out an update to an information set stored in a memory contained in a portable battery back-up data cartridge, the update representing a change to only a part of said information set and comprising a plurality of records to be stored at predetermined locations within the information set, the method comprising the steps of:
   transferring said records from a host computer to a buffer contained in said memory along with address information for each record;
   setting a flag contained in said memory on the data cartridge to indicate that all said records have been received by said buffer;
   transferring said records from said buffer to the information set stored in said memory at the address locations recorded with the records in said buffer; and
   setting said flag to indicate when said records have been transferred from said buffer to said information set, whereby in the event of a disconnection of said data cartridge from said host computer, while said update is being transferred to said data cartridge, said information set is not partially updated.

* * * * *